United States Patent [19]

Ludwig et al.

[11] Patent Number: 4,939,469

[45] Date of Patent: Jul. 3, 1990

[54] NON-DESTRUCTIVE METHOD FOR EVALUATION OF PRINTED WIRING BOARDS

[75] Inventors: Frank A. Ludwig, Rancho Palos Verdes; John McHardy, Westlake Village, both of Calif.

[73] Assignee: Hughes Aircraft Company, Los Angeles, Calif.

[21] Appl. No.: 226,709

[22] Filed: Aug. 1, 1988

[51] Int. Cl.$^5$ .................. G01R 27/00; G01R 27/20
[52] U.S. Cl. ............................ 324/694; 324/554; 324/640; 324/699; 324/707
[58] Field of Search ............... 324/62, 65 R, 158 R, 324/57 R, 57 SS, 71.1, 500, 554, 557, 674, 667, 694, 718, 719

[56] References Cited

U.S. PATENT DOCUMENTS

| 3,818,331 | 6/1974 | Schosser | 324/57 R |
|---|---|---|---|
| 3,904,839 | 9/1975 | Peoples | 324/520 |
| 3,960,004 | 6/1976 | Wirt et al. | 324/57 SS |
| 4,103,228 | 7/1978 | Ham | 324/62 |
| 4,175,253 | 11/1979 | Pitegoff | 324/62 |
| 4,432,037 | 2/1984 | Brabetz | 324/73 PC |
| 4,506,212 | 3/1985 | Melia | 324/57 SS |
| 4,565,966 | 1/1986 | Burr et al. | 324/73 PC |
| 4,683,422 | 7/1987 | Goodson | 324/62 |

FOREIGN PATENT DOCUMENTS 2143954 2/1985 United Kingdom ........... 324/73 PC

OTHER PUBLICATIONS

"Corrosion '85", by Kindig et al, paper #74, Intern. Corrosion Forum, 3/29/85.

Primary Examiner—Reinhard J. Eisenzopf
Assistant Examiner—W. Burns
Attorney, Agent, or Firm—M. E. Lachman; W. K. Denson-Low

[57] ABSTRACT

A method for evaluating characteristics of a printed wiring board by measuring the alternating current impedance spectra of the printed wiring board conductor pattern. The method is useful in evaluating a number of different characteristics, such as moisture content, delamination, interlayer thickness and surface characteristics.

19 Claims, 4 Drawing Sheets

NON-DESTRUCTIVE METHOD FOR EVALUATION OF PRINTED WIRING BOARDS

This invention was made with United States Government support under Contract No. FO8635-82-C-0001 awarded by the Department of the Air Force. The U.S. Government has certain rights in this invention.

BACKGROUND OF THE INVENTION

1. Field of the Invention

The present invention relates to methods for evaluating certain characteristics of printed wiring boards including moisture content, delamination, and surface defects, such as scratches. More particularly, the present invention relates to non-destructive methods used to make these evaluations.

2. Description of Related Art

Multilayer ceramic printed wiring boards (PWB's) are playing an increasing role in defense programs to raise the packing density of electronic circuits. The availability of a non-destructive test for identifying potentially defective boards early in the assembly process will greatly improve product reliability. In addition, such non-destructive testing will also be useful for optimizing process variables in the production of such ceramic PWB's.

Tests have shown that humidity exposure in combination with a direct current (DC) bias can cause short circuit failures in certain multilayer PWB's. Accordingly, it is important to make sure that PWB's are moisture free prior to circuit assembly. One option is to subject all printed wiring boards to a heating or dehydration step prior to circuit assembly. This dehydration step is certainly advisable for PWB's which have been exposed to moisture. However, prior to this invention, there was no simple way to tell when moisture removal was complete. Furthermore, many printed wiring boards may have been stored in conditions free from moisture so that drying is not necessary. In order to eliminate uncertainties about the need for drying of PWB's, it would be desirable to provide a simple, convenient and reliable non-destructive screening process which provides information on PWB moisture content.

Multilayer ceramic PWB's are also susceptible to delamination. Although severe cases of delamination can be identified visually, there are certain situations where delamination may be difficult to detect. Accordingly, there is also a need to provide for screening and detection of possible PWB delamination.

PWB's are typically coated with a glass or plastic coating which is designed to prevent moisture from becoming dispersed within the PWB. During transport and handling prior to circuit assembly, this outer protective coating many times becomes scratched. It is not possible by visual inspection alone to determine whether or not the scratches have compromised the moisture protection provided by the coating. Again, it would be desirable to provide a simple, efficient and reliable non-destructive process which could be used to screen such scratched PWB's in order to determine if the protective coating has been damaged sufficiently to allow moisture to enter into the printed wiring board layers.

Further, it would be desirable to provide some type of non-destructive method for monitoring characteristics of PWB's immediately after fabrication in order to optimize fabrication process parameters.

SUMMARY OF THE INVENTION

In accordance with the present invention, a non-destructive method is provided for evaluating a number of different characteristics of printed wiring boards. The method provides a simple, convenient and reliable method for monitoring and evaluating a number of important characteristics of a printed wiring board.

The method is based on the use of electrochemical impedance spectroscopy. More particularly, the method involves obtaining the alternating current (AC) impedance spectra between a conductor pattern printed or formed on the PWB and another conductor. The other conductor may be a second conductor pattern in the PWB or an external electrode connected via an electrolyte. If a second conductor pattern is used for the measurement, it may be a separate pattern on the same layer as the first pattern, or on a different layer separated from the first layer by an insulator material layer.

It was discovered that such AC impedance spectra when measured over frequencies within the range of about 0.1 millihertz to 20 kilohertz provide useful information regarding characteristics of the printed wiring board. It was found that differences in PWB moisture content, delamination, interlayer thickness and surface characteristics were detectable utilizing alternating current impedance spectra.

The AC impedance of an electrical circuit is characterized at a given AC frequency by two parameters. Most commonly, the two parameters used are the magnitude, $|Z|$, of the impedance, and the phase angle, $\theta$. Capacitive circuits such as those tested in the present work all have a negative phase angle between 0° and −90°. However, for simplicity, the minus sign is omitted throughout this specification.

As a feature of the present invention, the moisture content of a printed wiring board can be quickly and conveniently determined by measuring the AC impedance spectra between two conductor patterns within the printed wiring board and comparing it to the corresponding AC impedance spectra for a standard dehydrated board.

As a another feature of the present invention, the extent of delamination of a printed wiring board is also determined by measuring the AC impedance spectra. In addition, AC impedance spectra can be used to evaluate characteristics of the coatings used on printed wiring boards as well as providing information regarding interlayer thickness of the board.

The present invention is particularly well suited for use in evaluating printed wiring boards during fabrication. This type of evaluation allows the manufacturer to adjust operating parameters to obtain optimum conditions. In addition, the method has wide use in quality control procedures to insure that PWB's meet certain criteria for moisture content, delamination and integrity of protective coatings.

The above-discussed and many other features and attendant advantages of the present invention will become apparent as the invention becomes better understood by reference to the following detailed description when considered in conjunction with the accompanying drawings.

DESCRIPTION OF THE PREFERRED EMBODIMENTS

The present invention is based upon the discovery that alternating current (AC) impedance spectroscopy can be used to evaluate a number of characteristics of printed wiring boards. AC impedance spectroscopy (also known as electrochemical impedance spectroscopy) has recently emerged as a powerful tool for investigating the behavior of metal-insulator systems. Originally, the technique was developed for investigating the nature of corrosion processes under organic coatings (M. Kendig et al, "The Application Of Impedance Spectroscopy To The Evaluation Of Corrosion Protection By Inhibitors And Polymer Coatings", Paper No. 74, CORROSION 85, NACE, Houston, Tex., March 1985).

The equipment and systems utilized to make AC impedance measurements are well known. AC impedance measurement systems are commercially available from companies such as EG&G Princeton Applied Research in Princeton, N.J. A preferred system is the Model 368-1 AC impedance measurement system which is available from EG&G Princeton Applied Research and will be described in more detail in the following examples. Any conventional AC impedance measurement system can be used provided it can measure spectra over a frequency range of between about 0.1 millihertz to 20 kilohertz and is capable of providing voltages of up to 5 volts.

The present invention involves measuring the AC impedance spectra between two conductor patterns on a printed wiring board or between one conductor pattern and an external electrode. The invention has application to a wide variety of printed wiring boards including epoxy-glass, polyimide-glass and ceramic PWB's. The method can be used to evaluate single layer or multilayer PWB's and can be used with conductor patterns made from copper, copper alloys and other metals conventionally used to form conductor patterns. The AC impedance spectra can be measured between conductor patterns on different PWB layers or between conductor patterns on a single layer. Also, measurements between one conductor pattern and an external electrode in an electrolyte can be made. This latter type of measurement requires the use of a reference electrode. The invention is particularly well suited for evaluating multilayer ceramic PWB's having copper metal conductor patterns. The following detailed description will be limited to a discussion of ceramic PWB's having copper conductor patterns with it being understood that the invention has wide application to other types of PWB's.

A characteristic of multilayer ceramic PWB's which can be evaluated by AC impedance spectra is moisture content. The moisture content is evaluated by measuring the AC impedance spectra between at least one pair of conductor patterns present in a multilayer board. It was discovered that impedance spectra when measured over frequencies between 0.1 millihertz to 20 kilohertz can detect differences in moisture levels. When moisture is not present, the pair of conductor patterns act as a pure capacitor and the spectra of log (impedance magnitude) versus log (current frequency) or of phase angle versus log (current frequency) should be straight lines. However, when moisture is present, the impedance spectra deviate from the straight line spectra produced by dry circuit boards. The phase angle versus log (current frequency) spectrum is more sensitive to moisture differences than the log (impedance magnitude) versus log (current frequency) spectrum. In addition, both types of AC impedance spectra are more sensitive to moisture differences at frequencies between 0.1 hertz to 10 hertz.

Qualitative information to determine the presence of moisture in the multilayer ceramic PWB can be obtained by simply running the AC impedance spectra and determining if the conductor pattern deviates from pure capacitor behavior. In addition, quantitative information may be obtained by measuring AC impedance spectra for standard PWB's having known moisture contents. The spectra from PWB's having unknown moisture content can then be compared to the standard spectra to determine approximate levels of moisture contents if desired.

As described in Example 5, it was found that moisture distributes evenly throughout all layers of the multilayer ceramic printed wiring board. Accordingly, it is only necessary to measure the AC impedance spectra between conductor patterns in one region of the multilayer board in order to accurately measure moisture content for all regions. However, if desired, the impedance spectra for several pairs of conductor patterns can be measured. The DC resistance between pairs of conductor patterns in a ceramic PWB is usually between about $10^7$ ohms and $10^{10}$ ohms. As a result, applied voltages of up to five volts may be required in order to obtain the minimum current necessary for making impedance spectra measurements. In general, the applied voltage amplitude is set at the lowest value needed to elicit a current response that is clearly distinguishable from the background noise. Larger voltage amplitudes may yield a distorted response, especially if the test circuit contains non-linear elements. Non-linearity can arise when the measurement is made between one conductor pattern in a PWB and an external electrode, connected via an electrolyte.

Another characteristic which can be measured with AC impedance spectra is delamination of the printed wiring board. When delamination is present, the impedance of each point in the spectrum is shifted upward towards larger values from the impedance obtained for a non-delaminated board. This effect can be seen in FIG. 2 where the points depict the spectrum for a delaminated board and the solid line depicts the spectrum of a non-delaminated board. AC impedance spectra can also be used to provide information on the interlayer thickness of the printed wiring board.

AC impedance spectra were also found to be quite useful in evaluating the effect of scratches in the protective coatings conventionally used on ceramic PWB's. In general, ceramic PWB's are protected by a thin glass coating which prevents absorption of moisture by the ceramic layers. If the coating becomes scratched, the entire board is generally discarded because of the possibility of moisture penetration. In accordance with the present invention, the AC impedance spectra of such scratched PWB's can be measured to determine if in fact the protective coating has been penetrated by moisture.

The measurement of AC impedance spectra is also useful as a quality control test to insure that printed wiring useful as a quality control requirements with respect to boards meet certain requirements with respect to moisture content, lack of delamination, interlayer thickness and surface coating characteristics. This is done by measuring the AC impedance spectra of the printed wiring board after it is manufactured and comparing the spectra to the AC impedance spectra of a standard printed wiring board that meets design specifications.

Examples of practice of the present invention are as follows:

EXAMPLE 1

Evaluation of PWB Delamination

Two similar 3"×4" (7.62×10.16 cm) PWB's were evaluated by measuring their respective impedance spectra between conductor patterns on the voltage and ground planes. The two PWB's were conventional multilayer ceramic boards having copper conductor patterns. The only difference between the two boards was that one contained visible delaminations.

Figures 1, 9:
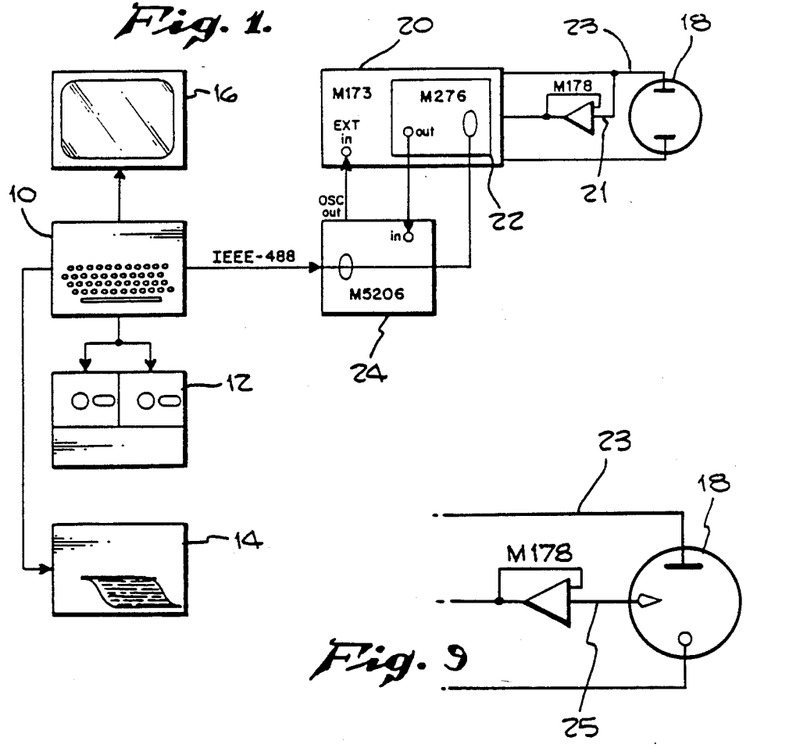
FIG. 1 is a diagram of an exemplary AC impedance measurement system utilized to obtain AC impedance spectra of printed wiring boards.
FIG. 9 is a diagram of the circuit used when measurements were made between one conductor pattern and a reference electrode.

The impedance spectra were obtained using a conventional system available from EG & G Princeton Applied Research (PAR) as the PAR Model 368 AC Impedance Measurement System. A simplified schematic of the Model 368 system is shown in FIG. 1. The system included a personal computer (PC) 10 connected to two 5¼" (14.0 cm) disc drives 12. The computer was also connected to a printer 14 and cathode ray tube (CRT) display 16. The computer was programmed with the PAR Model 368 AC Impedance Software System. The pair of conductor patterns in the test PWB 18 was connected to a PAR Model 173 Potentiostat/Galvanostat 20 combined with a PAR Model 276 Interface Plug-in 22. The units 20 and 22 were connected to a PAR Model 5026 Computer-Controlled Lock-In System 24 which in turn was connected to the computer 10. The same PAR Model 368 AC Impedance Measurement System was used in all of the examples described herein to determine impedance spectra.

Figure 2:
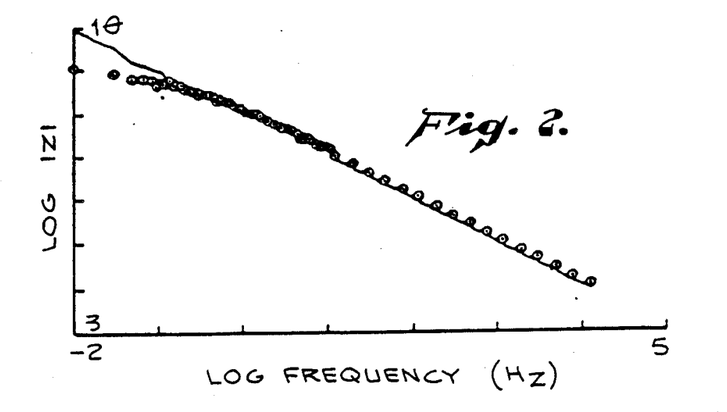
FIG. 2 compares impedance magnitude versus current frequency spectra for a delaminated PWB and a structurally sound PWB.

The impedance spectra obtained with the above system for the two PWB's are shown in FIG. 2. For the two-terminal measurements in Examples 1-6 and 8-10, the M178 electrometer probe 21 was connected to the "counter electrode" lead 23. The solid line is the spectrum for the PWB with no visible defects. The points represent the spectrum for the delaminated board. As can be seen, the defective (i.e., delaminated) PWB exhibited measurably larger impedances than the normal board. This example demonstrates that measuring the impedance spectra provides a convenient method for screening the PWB for possible delamination.

EXAMPLE 2

Evaluation of the Effect of Humidity-Bias on PWB's

Tests were performed to show the correlation between phase angle ($\theta$) data and the tendency of a board to develop short circuit failures when subjected to humidity and a DC bias. For these tests, a vacuum desiccator from GCA Precision Scientific, catalog number 68351, was used as an environmental chamber. The metal lid was replaced with a block of plexiglass containing a number of electrical feed-throughs. The heater setting was adjusted to maintain a temperature of 85° C. The relative humidity was controlled at a nominal 85% by placing 200 ml of a 48 wt. % glycerol solution in beakers at the bottom of the chamber. A DC bias of 5 V was applied between the voltage and ground planes of each PWB. Condensation on the inside of the lid was prevented by radiant heat from an infrared lamp.

Figure 3:
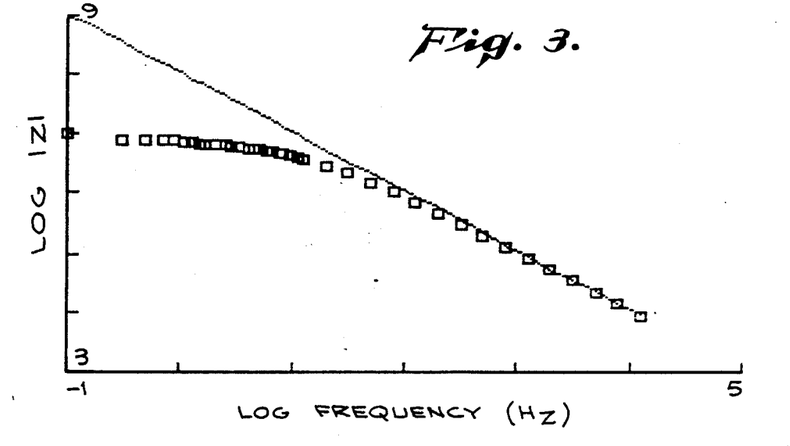
FIG. 3 compares impedance magnitude versus current frequency spectra for a printed wiring board that was moisturized and then dried.
Figure 4:
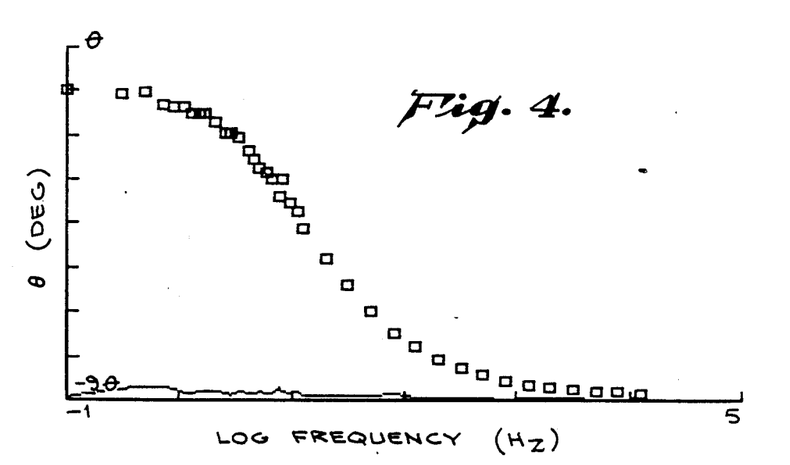
FIG. 4 compares phase angle versus current frequency spectra for the same PWB as in FIG. 3.

Impedance spectra before and after humidity-bias exposure are illustrated for a typical board in FIGS. 3 and 4. The squares depict the spectra after humidity bias exposure and the lines depict the spectra before exposure. Changes in phase angle ($\theta$) measured at 0.1 Hz over a series of tests on four PWB's are given in Table 1 as well as values on the PWB's as received (AS REC'D) from the commercial supplier. Humidity-bias exposure clearly increased the deviation from pure capacitive behavior. DC resistance measurements performed on the boards after humidity bias exposure revealed that short circuits had developed in the two boards that showed the largest deviation of phase angle from 90°.

Further tests showed that the deviation in phase angle could be reversed by heating the board in air. This result, combined with the observed change in phase angle produced by humidity, demonstrates that the phase angle at low frequency is sensitive to the moisture content of a board.

Accordingly, it is apparent that measurement of the AC impedance spectra of PWB's provides useful information about the moisture content of the board and provides a convenient method for screening PWB's to ensure that they meet the low moisture requirements necessary for use in critical electronic equipment.

TABLE 1.

| | Effect of humidity/bias* exposure on impedance phase angle | | | | |
|---|---|---|---|---|---|
| | CUMULATIVE TIME, HRS. | BOARD 1 | BOARD 2 | BOARD 3 | BOARD 4 |
| AS REC'D | — | 40 | 30 | 60 | 90 |
| HUM/BIAS | 6 | 10 | 10 | 90 | 90 |
| HUM/BIAS | 30 | 10 | 10 | 10 | 50 |
| HUM/BIAS | 54 | 10 | 10 | 10 | 35 |
| 110° C., AIR | 62 | 90 | 35 | 80 | 90 |

TABLE 1.-continued

| | Effect of humidity/bias* exposure on impedance phase angle | | | | |
|---|---|---|---|---|---|
| | CUMULATIVE TIME, HRS. | BOARD 1 | BOARD 2 | BOARD 3 | BOARD 4 |
| HUM/BIAS | 70 | 20 | 10 | 40 | 70 |

*85% Relative Humidity, 85° C., 5V DC Bias

EXAMPLE 3

Evaluation of PWB Moisture Content

Figure 5:
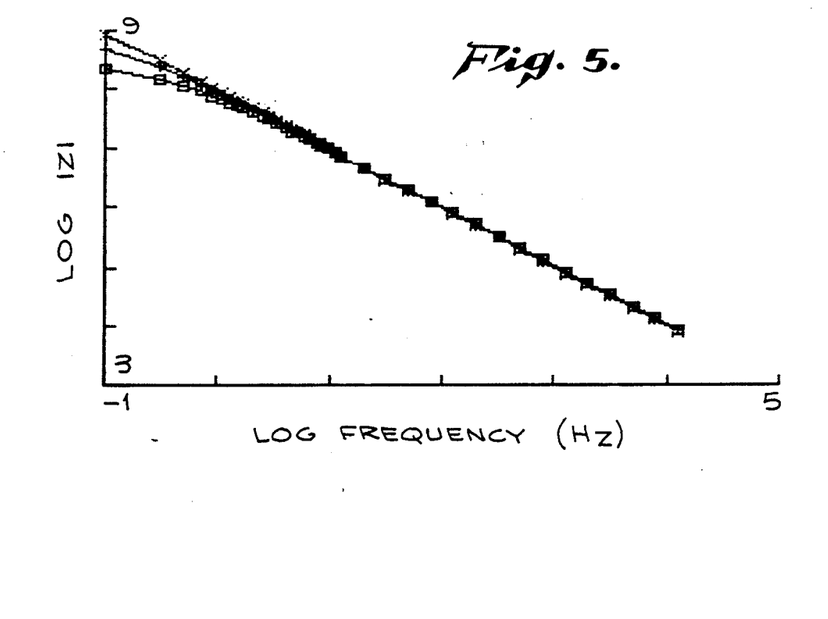
FIG. 5 compares impedance magnitude versus current frequency spectra for three different PWB's.
Figure 6:
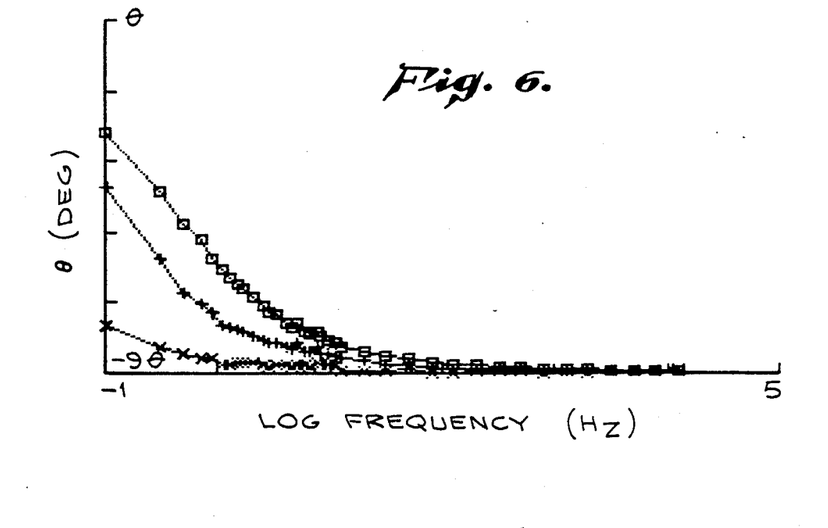
FIG. 6 compares phase angle versus current frequency spectra for the same three PWB's as in FIG. 5.

Impedance spectra recorded between voltage and ground planes on three 3"×4" multilayer ceramic PWB's from two manufacturers are shown in FIGS. 5 and 6. At higher frequencies, all three boards resembled pure capacitors; exhibiting a slope, d(log Z)/d(log f), of −1 and a phase angle, $\theta$, close to 90°. However, at lower frequencies, the phase angle (and to a lesser extent, the magnitude of the impedance) began to deviate from ideal capacitor behavior. It is likely that this deviation resulted from leakage resistances within the boards. Both the impedance spectra and phase change spectra show that each of the boards contains a different amount of moisture. The differences in the AC impedance spectra shows up more clearly in the phase change spectra (FIG. 6) than in the impedance spectra. However, both spectra provide useful information which demonstrates differences in the moisture content of the boards.

EXAMPLE 4

Evaluation of Surface Scratches and Moisture Resistance

As previously mentioned, it is difficult to determine if surface scratches in the glass protective layer on a PWB are sufficient to affect the moisture resistance provided by the protective layer. This example demonstrates the usefulness of the present method in providing a convenient procedure for determining if surface scratching of the PWB is severe enough to reduce the moisture resistance of the board.

Twenty 2"×2" (5 cm×5 cm) multilayer ceramic PWB's having a protective top glass coating were rated visually on the basis of number and depth of scratches in the glass coating. The PWB's were all from a single lot received from the manufacturer. Impedance spectra were recorded on the boards as received, and again after a three-day exposure to humidity and temperature (H/T) cycling in accordance with MIL-S-202F (Test Methods for Electronic and Electrical Component Parts), Method 106E. Following the humidity exposure, the boards were redried by prolonged heating in air at 110° C. Table 2 lists the "scratch ratings" and shows the variation of phase angle at 0.1 Hz for each board during the test. The latter parameter will be referred to hereafter as the "impedance rating". The three-day exposure to humidity cycling caused substantial moisture pickup by almost all of the boards. With only two exceptions, every board exhibited a $\theta$ value that was closer to 0° than 90°.

TABLE 2

| | Effect of humidity/temperature cycling on impedance rating (the phase angle at 0.1 Hz) for scratched boards | | | | |
|---|---|---|---|---|---|
| SCRATCH RANK* | AS REC'D | DRIED 4 HRS. @ 110° C. | H/T CYCLED 3 DAYS | DRIED 4 DAYS @ 110° C. | DRIED 7 DAYS @ 110° C. |
| 13 | 80 | 85 | 25 | 30 | 37 |
| 4 | 75 | 87 | 25 | 90 | |
| 2 | 20 | 50 | 10 | 20 | 17 |
| 9 | 35 | 80 | 30 | 70 | 82 |
| 18 | 30 | 70 | 20 | 85 | 85 |
| 3 | 80 | 80 | 20 | 85 | 85 |
| 17 | 60 | 85 | 30 | 35 | 30 |
| 11 | 80 | 80 | 15 | 85 | |
| 14 | 80 | 80 | 30 | 45 | 84 |
| 5 | 20 | 70 | 20 | 85 | |
| 16 | 60 | 80 | 15 | 85 | |
| 10 | 75 | 85 | 20 | 20 | |
| 8 | 70 | 80 | 40 | 85 | |
| 1 | 85 | 85 | 20 | 80 | |
| 12 | 75 | 80 | 20 | 85 | |
| 15 | 45 | 80 | 25 | 90 | |
| 6 | 80 | 85 | 20 | 85 | |
| 19 | 80 | 80 | 15 | 80 | |
| 20 | 85 | 80 | 45 | 85 | 83 |
| 7 | 85 | 85 | 75 | 90 | |

*20 = Best; 1 = Worst

Table 2 shows that there was no apparent relationship between the scratch ranking of a board and its impedance rating. Accordingly, even though the boards varied widely in the severity of surface scratches, some other factor (perhaps related to glass porosity) apparently controlled their susceptibility to moisture pickup.

Figure 7:
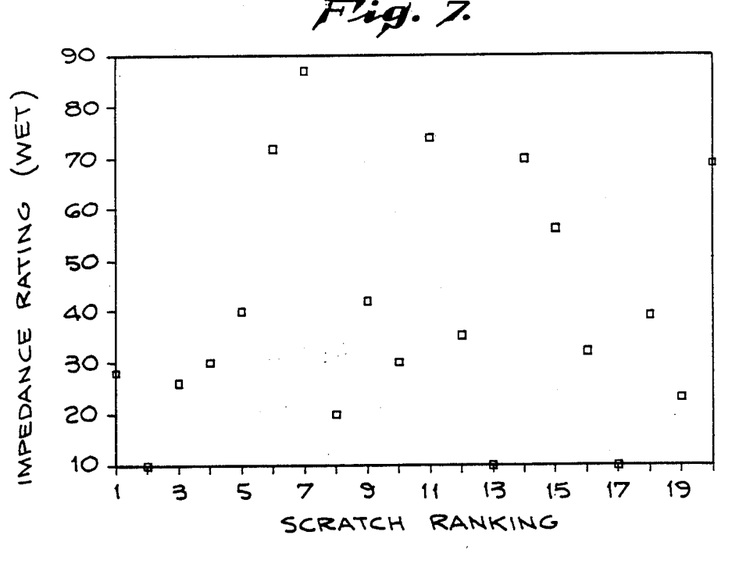
FIG. 7 is a graphic representation of tests conducted to correlate the severity of surface scratching with the impedance rating of PWB's.

A second series of tests were performed to obtain greater discrimination among the PWB's. The tests employed a humidity exposure consisting of 2 hours in a steam autoclave at 130° C. Results of the AC impedance spectra measurements are illustrated in FIG. 7. As can be seen, there was again no correlation between the scratch ranking of a board and its susceptibility to moisture pickup. This again shows that visual inspection of scratches in the glass coating of a PWB is not a reliable indication of the moisture protection provided by the coating. Instead, AC impedance spectra provides a quick, convenient and reliable method for screening scratched PWB's to determine if the scratches are severe enough to adversely affect the moisture protection provided by the glass coating and thus warrant rejection of the board.

EXAMPLE 5

Evaluation of Moisture Distribution in Multilayer PWB's

Twelve of the scratched boards used in Example 4 were dried until the impedance rating O determined by AC impedance spectra was at least 75. In addition, some of the boards were wired up to provide single-terminal access to the metallized pad contacts. With these boards, impedance spectra could be compared for both inner and outer layers of the board. Data for the inner layers was obtained by the usual measurement between voltage and ground planes. Data for the outer layers was obtained by measuring impedances between the voltage and pad planes.

Figure 8:
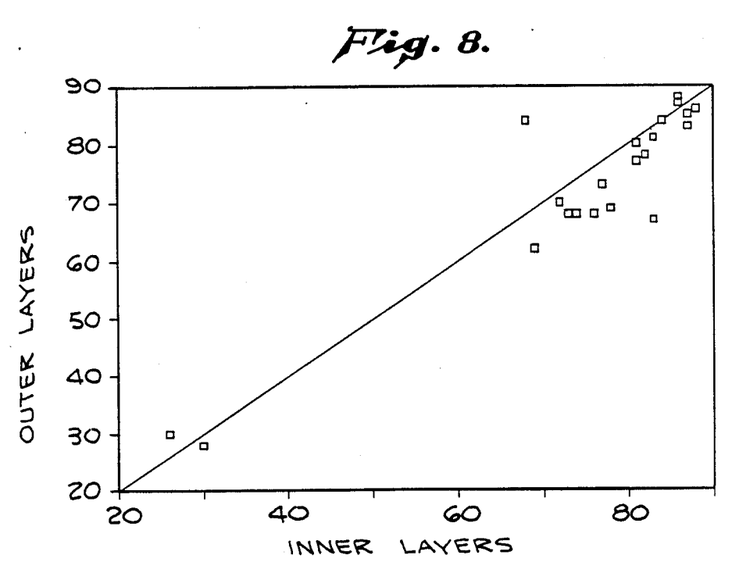
FIG. 8 is a plot of impedance rating for inner vs. outer layers of PWB's with various moisture contents The plot reveals a similarity of moisture content in different layers of a multilayer PWB.

FIG. 8 compares impedance rating values at 0.1 Hz for inner and outer layers of boards after various exposures. To a reasonable approximation, the points lie on a straight line of unit slope, showing virtually no difference in moisture content between inner and outer layers. The finding is consistent with the view that the glass surface layer on a board is the controlling factor in moisture pickup. Accordingly, differences observed among boards in their susceptibility to moisture pickup reflect variations in permeability of the glass layer. Once the glass layer is penetrated by moisture, the AC impedance spectra show that the moisture disperses and equilibrates uniformly throughout all layers of the multilayer PWB.

EXAMPLE 6

Evaluation of Conformal Coating

Six boards were given a conformal coating of parylene (a polymerized para-xylylene) and the moisture content was rechecked. The boards were subject to 24 hours of temperature and humidity cycling in accordance with MIL-S-202F, Method 106E. Phase angles measured during the tests are summarized in Table 3. They show that a parylene coating completely eliminated moisture pickup during the 24 hour humidity cycling test. Uncoated boards exposed at the same time suffered significant moisture pickup and the impedance ratings for these boards dropped by 18 to 69 during the test.

TABLE 3

| BOARD NUMBER | DRIED[1] | PARYLENE COATED[2] | HUMID CYCLE[3] |
|---|---|---|---|
| 911 | 81 | 87 | 82 |
| 940 | 74 | 70 | 78 |
| 942 | 85 | 83 | 82 |
| 943 | 83 | 87 | 83 |
| 948 | 77 | 73 | 76 |
| 951 | 77 |  | 28 |
| 952 | 85 |  | 65 |
| 961 | 87 | 84 | 77 |
| 962 | 85 |  | 16 |
| 980 | 87 |  | 22 |
| 983 | 87 |  | 69 |

TABLE 3-continued

Effect of various treatments on impedance phase angle

| BOARD NUMBER | DRIED[1] | PARYLENE COATED[2] | HUMID CYCLE[3] |
|---|---|---|---|
| 990 | 80 |  | 18 |

Footnotes:
[1]Various drying treatments were used.
[2]Measured after application of Parylene coating.
[3]Measured after 24 hour temperature and humidity cycle.

EXAMPLE 7

Evaluation of Process Controls

Comparative tests were performed to demonstrate that the type of oven used for applying the final glaze layer on a PWB might affect the porosity of that glaze. AC impedance spectra measurements were made between a metallized layer within the board and an external counter electrode. A slightly different circuit 18A, as shown in FIG. 9, was used for measurements such as those in Example 7. These measurements were made between one conductor pattern and an external electrode, where both were immersed in a common electrolyte. In this case, the M178 electrometer probe 25 was connected to a reference electrode (such as a saturated calomel electrode) immersed in the same solution, instead of being connected directly to counter electrode lead 23 as was the case for Examples 1-6 and 8-10.

Contact was established by immersing the board and the counter electrode in a 3 molar solution of sodium chloride as the electrolyte. The impedance spectra showed a qualitative dependence on the type of oven (convective or infrared) used for the glazing operation. The results demonstrate that impedance spectroscopy can provide information on the character of the glaze layer and therefore provides a valuable tool for optimizing process variables in the production of ceramic circuit boards.

EXAMPLE 8

Evaluation of PWB Interlayer Thickness

At a frequency of 20 kHz, the measured impedance magnitude between the voltage plane and the ground plane of a 2"×2" ceramic multilayer board was approximately 15 kilohms. This corresponds to a capacitance value of approximately 530 picofarads (pf). A calculation of the expected capacitance, using nominal values for interlayer thickness and dielectric constant of the insulator, yields 500 pf. This agreement in capacitance values shows that AC impedance spectroscopy provides the required sensitivity necessary to distinguish lot-to-lot variations in the thickness of the dielectric layers in PWB's.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein, but is only limited by the following claims.

What is claimed is:

1. A method for evaluating the moisture content, delamination or interlayer thickness of a printed wiring board wherein said printed wiring board includes at least one layer having a conductor pattern formed thereon, said method comprising the step of measuring the alternating current impedance spectra between said conductor pattern and another conductor over a plurality of frequencies within the range of about 0.1 millihertz to 20 kilohertz to evaluate the moisture content, delamination or interlayer thickness of said printed wiring board.

2. A method according to claim 1 wherein said moisture content of said printed wiring board is being evaluated.

3. A method according to claim 2 wherein the frequencies over which said alternating current impedance spectra is measured comprises 0.1 hertz to 10 hertz.

4. A method according to claim 1 wherein said delamination of said printed wiring board is being evaluated.

5. A method according to claim 1 wherein said interlayer thickness of said printed wiring board is being evaluated.

6. A method according to claim 1 wherein said printed wiring board includes a glass coating and wherein the characteristics of said glass coating are evaluated.

7. A method according to claim 1 wherein the frequencies over which said alternating current impedance spectra is measured comprises 0.1 hertz to 10 hertz.

8. A method according to claim 1 wherein the voltage used to determine said alternating current impedance spectra is below about 1.0 volt.

9. A method according to claim 8 wherein the voltage used to determine said alternating current impedance spectra is below about 0.1 volt.

10. A method according to claim 1 wherein said printed wiring board comprises two said layers having a conductor pattern formed thereon and an insulator material between said two layers, and said spectra is measured between said two layers.

11. A method according to claim 1 wherein said one layer comprises two separate conductor patterns, and said spectra is measured between said two conductor patterns on said one layer.

12. A method according to claim 1 wherein said another conductor comprises an electrode external to said printed wiring board and said one layer and said electrode are immersed in a common electrolyte to measure said spectra.

13. A method for evaluating the moisture content, delamination or interlayer thickness of a printed wiring board wherein said printed wiring board includes at least one layer having a conductor pattern formed thereon, said method comprising the steps of:

measuring the alternating current impedance spectra between said conductor pattern and another conductor over frequencies within the range of about 0.1 millihertz to 20 kilohertz; and comparing said alternating current impedance spectra to a standard alternating current impedance spectra obtained from a printed wiring board having known moisture content, delamination or interlayer thickness to thereby evaluate the moisture content delamination or interlayer thickness of said printed wiring board.

14. A method according to claim 13 wherein the frequencies over which said alternating current impedance spectra is measured comprises 0.1 hertz to 10 hertz.

15. A method according to claim 13 wherein said moisture content of said printed wiring board is being evaluated.

16. A method according to claim 15 wherein the frequencies over which said alternating current impedance spectra is measured comprises 0.1 hertz to 10 hertz.

17. A method according to claim 15 wherein said alternating impedance spectra is compared to a plurality of standard alternating current impedance spectra obtained from a plurality of printed wiring boards having different known moisture contents to thereby provide evaluation of the moisture content of said printed wiring board.

18. A method according to claim 13 wherein said delamination of said printed wiring board is being evaluated.

19. The method according to claim 13 wherein said interlayer thickness of said printed wiring board is being evaluated.

* * * * *

UNITED STATES PATENT AND TRADEMARK OFFICE
CERTIFICATE OF CORRECTION

PATENT NO.  : 4,939,469
DATED       : July 3, 1990
INVENTOR(S) : FRANK A. LUDWIG and JOHN MC HARDY It is certified that error appears in the above-identified patent and that said Letters Patent is hereby corrected as shown below:

Col. 9, line 15, after "75", insert -- °(degree symbol) --.
       line 28, after moisture, delete -- -(a hyphen) --.
       line 52, after "69", insert -- °(degree symbol) --.

Col. 11, line 14, after "claim", insert --1--.
        line 16, after "claim", insert --1--.

Col. 12, line 31, after "alternating", insert --current--.

Signed and Sealed this

Twenty-seventh Day of August, 1991

Attest:

HARRY F. MANBECK, JR.

Attesting Officer

Commissioner of Patents and Trademarks